United States Patent [19]

Shin

[11] Patent Number: 5,732,101
[45] Date of Patent: Mar. 24, 1998

[54] VCSEL DEVICE AND OPTICAL PICKUP APPARATUS ADOPTING THE SAME

[75] Inventor: Hyun-kuk Shin, Suwon, Rep. of Korea

[73] Assignee: Samsung Electronics Co., Ltd., Kyungki-do, Rep. of Korea

[21] Appl. No.: 635,404

[22] Filed: Apr. 26, 1996

[30] Foreign Application Priority Data

Apr. 28, 1995 [KR] Rep. of Korea ............... 1995-10346

[51] Int. Cl.$^6$ ...................................... H01S 3/085
[52] U.S. Cl. ................ 372/92; 372/96; 372/50; 257/82
[58] Field of Search ................ 372/50, 96, 92; 257/82

[56] References Cited

U.S. PATENT DOCUMENTS

| 5,136,152 | 8/1992 | Lee | 369/112 |
|---|---|---|---|
| 5,136,603 | 8/1992 | Hasnain et al. | 372/50 |
| 5,475,701 | 12/1995 | Hibbs-Brenner | 372/50 |
| 5,533,041 | 7/1996 | Matsuda et al. | 372/50 |
| 5,574,744 | 11/1996 | Gaw et al. | 372/50 |

FOREIGN PATENT DOCUMENTS

| 62-188385 | 8/1987 | Japan | 372/96 |
|---|---|---|---|
| 3161980 | 7/1991 | Japan | 372/50 |

Primary Examiner—Rodney B. Bovernick
Assistant Examiner—Ellen Eunjoo Kang
Attorney, Agent, or Firm—Sughrue, Mion, Zinn, Macpeak & Seas, PLLC

[57] ABSTRACT

A vertical cavity surface emitting laser (VCSEL) device with an integral photodetector structure has improved intensity control characteristics. A laser optical source of the VCSEL emits light upward through a cavity formed in an upper electrode. A monitoring photodetector is formed below the laser optical source to receive light transmitted from the source downward. The intensity of the light transmitted downward from the optical source is proportional to the intensity of the light emitted upward through the cavity. Thus the detection signal provided by the photodetector sensing the downward transmitted light may be used for precise control of the driving voltage applied to the optical source. Because to the proportionality between the upward and downward emitted light, this control arrangement allows for improved control of emitted intensity of the VCSEL. An optical pickup apparatus adopting the improved VCSEL is also disclosed. For the optical pickup device, the VCSEL is enclosed in a housing having a window for allowing transmission of emitted light from the VCSEL without alteration of the direction of propagation. An optical converging means (a lens) focusses the emitted light onto an optical recording medium, which reflects the light back to the housing via the lens. When the light reflected from the recording medium passes back through the window, the optical path of the reflected light is changes so as to cause the light to impinge upon a photodetector. The window may be embodied as a hologram device.

24 Claims, 9 Drawing Sheets

VCSEL DEVICE AND OPTICAL PICKUP APPARATUS ADOPTING THE SAME

BACKGROUND OF THE INVENTION

The present invention relates to a vertical cavity surface emitting laser (VCSEL) device and to an optical pickup apparatus adopting the same, and more particularly, to a VCSEL device in which an optical source and a photodetector are integrally formed on a semiconductor substrate, and an optical pickup apparatus adopting the same.

In contrast to the operation of an edge emitting laser, a VCSEL emits light vertically with respect to the upper surface of a stacked semiconductor layer. Also, since the VCSEL emits a Gaussian-shaped beam, i.e., nearly circular, there is no need for optically correcting the shape of the emitted light. Also, a VCSEL can be made small enough so that the integration of a two-dimensional array of such devices can be integrated on the semiconductor substrate, for wide application to the computer industry, audio/video apparatuses, laser printers and scanners, medical equipment and the telecommunications field.

However, the inherent structure required for the VCSEL's vertical emission of light, in which one of the emitting surfaces is coupled to the substrate, impedes the installation of a monitoring photodetector needed for controlling the emitted light. Here, the monitoring photodetector may be realized by an annular photodetector provided around the periphery of the optical source, to receive spontaneous light emitted laterally when the optical source is driven, or by a planar photodetector placed atop the optical source itself.

Figure 1:
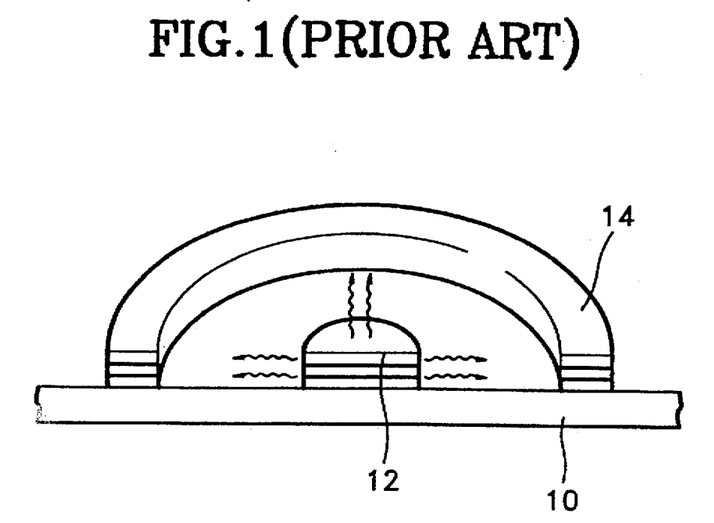
FIG. 1 is a schematic perspective view showing an example of a conventional VCSEL.

Referring to FIG. 1, showing a conventional VCSEL with a monitoring photodetector which is disclosed in U.S. Pat. No. 5,285,466, there is comprised a semiconductor substrate 10, an optical source 12 integrated on substrate 10 for emitting light when forward-biased, and an annular monitoring photodetector 14 for receiving spontaneous light emitted laterally from the sides of optical source 12. Here, the photodetector, which may be reverse-biased or operated with no voltage applied, receives the spontaneous light from the optical source and converts the received light into an electrical signal which is then fed back to an electrode of the optical source so that the light amount can be controlled. Such laterally emitted spontaneous light, however, is not proportional to the amount of light emitted vertically so that accurate control of the optical source is difficult and its relatively low intensity impairs proper detection.

Figure 2:
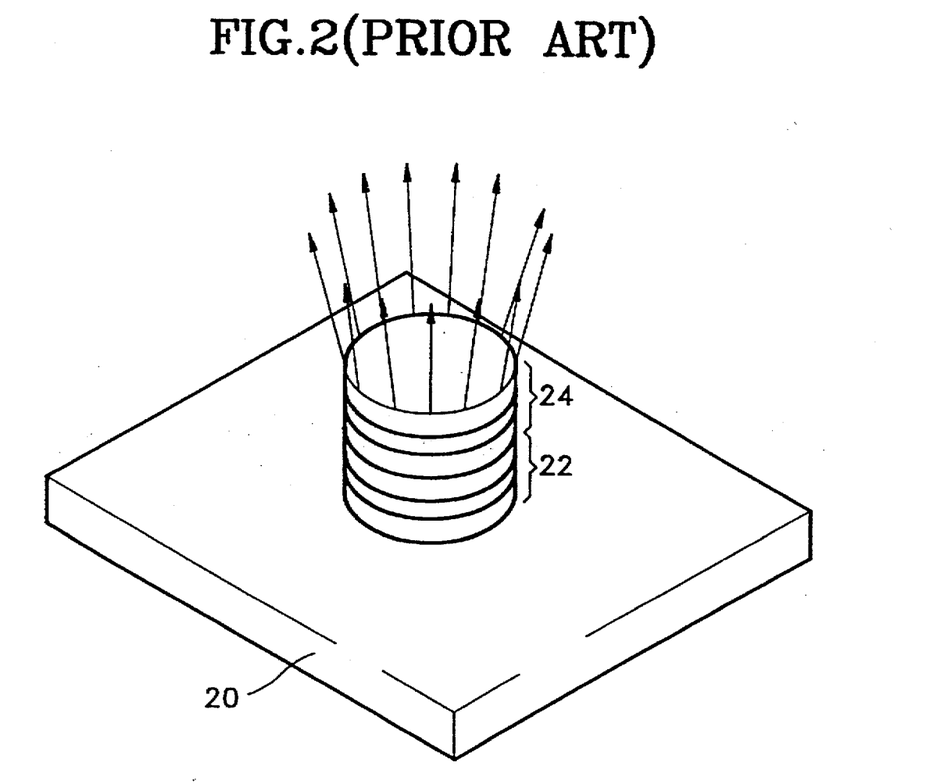
FIG. 2 is a schematic perspective view showing another example of a conventional VCSEL.

Therefore, referring to FIG. 2, another conventional VCSEL integrally having a monitoring photodetector is proposed. Here, an optical source 22 is formed on a semiconductor substrate 20, and a monitoring photodetector 24 is formed directly atop optical source 22. In this case, photodetector 24 receives a proportion of the light emitted from the optical source, for detection and conversion into a monitoring signal, and allows the remainder thereof to pass through. Though the received light is sufficient for performing the monitoring function, the amount of usable light transmitted through monitoring photodetector 24 is markedly decreased.

SUMMARY OF THE INVENTION

To solve the above problems, it is a first object of the present invention to provide a VCSEL device having a compact structure for integrally forming an optical source with a photodetector, which increases efficiency in use of the emitted light.

It is the second object of the present invention to provide an optical pickup apparatus adopting the above VCSEL device in which an optical source, a monitoring photodetector and a main photodetector are integrally formed.

To achieve the first object, there is provided a vertical cavity surface emitting laser device comprising: a semiconductor substrate; a photodetector having an intrinsic buffer layer formed on the semiconductor substrate for receiving light incident thereto and a first electrode layer formed on the intrinsic buffer layer; and an optical source having a first distributed Bragg reflecting (DBR) stack formed on the first electrode layer for reflecting most of light incident thereto and transmitting the remainder thereof, an active layer formed on the first DBR stack for generating light, a second distributed Bragg reflecting (DBR) stack formed on the active layer for reflecting most of light incident thereto and transmitting the remainder thereof, and a second electrode layer formed on the second DBR stack formed with a cavity via which light passed through the second DBR stack is emitted, wherein the first electrode layer has an exposed surface on which the optical source is not formed, and a terminal for connecting the first electrode layer with an external power source is formed on the exposed surface.

To achieve the second object, there is provided an optical pickup apparatus comprising: a VCSEL device including a semiconductor substrate, a first photodetector having an intrinsic buffer layer and a first electrode layer which are stacked on the semiconductor substrate in sequence, and an optical source having a first DBR stack, an active layer and a second DBR stack formed with a cavity which are stacked on the first electrode layer in sequence, wherein the first electrode layer has an exposed surface on which the optical source is not formed, and a terminal for connecting the first electrode layer with an external power source is formed on the exposed surface; an object lens placed between the optical source and an optical recording medium, for focusing light emitted from the optical source to form a spot on the optical recording medium; light path changing means located between the object lens and the optical source, for changing the path of light incident from the object lens with respect to the path of light incident from the optical source; and a second photodetector for detecting light passed through the light path changing means.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 3A:
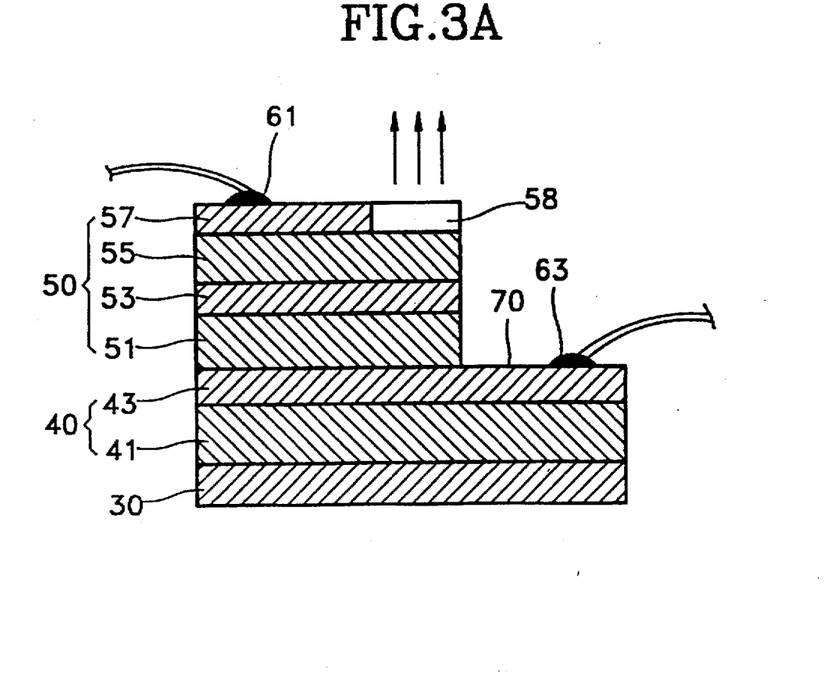
FIGS. 3A and 3B are a sectional view and a plan view of the first embodiment of a VCSEL device according to the present invention, respectively.
Figure 3B:
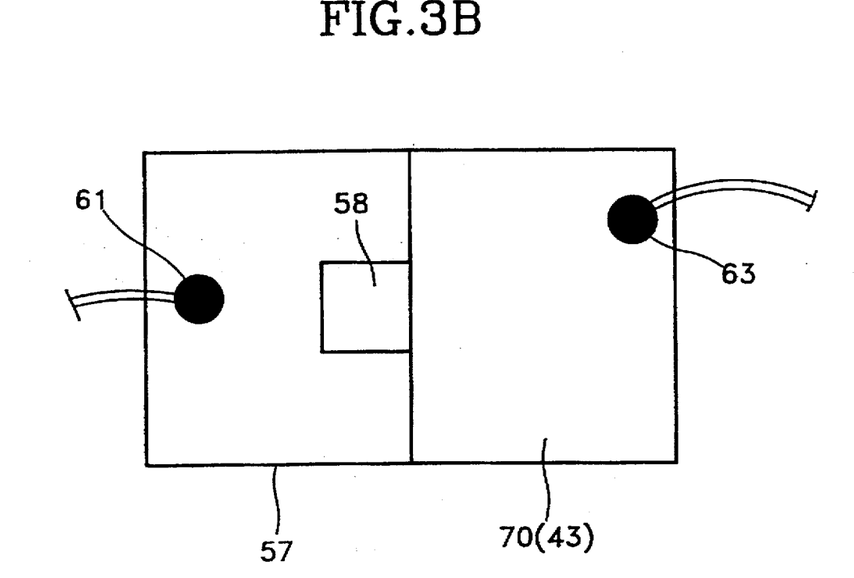

As shown in FIGS. 3A and 3B, the first preferred embodiment of a vertical cavity surface emitting laser (VCSEL) device according to the present invention comprises a semiconductor substrate 30, a photodetector 40 stacked on semiconductor substrate 30, and an optical source 50.

Semiconductor substrate 30 is electrically connected to an external power source and doped with semiconductor material such as gallium-arsenic (GaAs) including an n- or p-type impurity. Here, intrinsic semiconductor material may be used instead.

Photodetector 40 is comprised of a buffer layer 41 made of intrinsic semiconductor substance stacked on semiconductor substrate 30, and a first electrode layer 43 including an n-type or p-type impurity. Here, photodetector 40 operates by applying a reverse-biased voltage across semiconductor substrate 30 and first electrode layer 43, which are formed on either side of buffer layer 41, taking the voltage applied to first electrode layer 43 as a reference. Thus, light emitted from the bottom of optical source 50 is received by reverse-biased photodetector 40 and converted into an electrical signal. It is preferable that photodetector 40 shares the same strata as the VCSEL itself. Alternatively, photodetector 40 may be a typical light receiving device. Instead of reverse-biasing as above, photodetector 40 may be operated with no voltage applied, in which case its light-detecting efficiency is somewhat decreased. Also, photodetector 40 can serve as both monitoring photodetector and main photodetector according to the arrangement thereof, which will be described later.

Optical source 50 is made of the VCSEL and uses first electrode layer 43 as a lower electrode layer. Optical source 50 is comprised of an active layer 53 for generating a laser beam, first and second distributed Bragg reflecting (DBR) stacks 51 and 55 which are formed on either side of the active layer, respectively, and a second electrode layer 57 formed on second DBR stack 55.

First DBR stack 51 is located on first electrode layer 43, which is a semiconductor doped with the same type of impurity as that of first electrode layer 43. For example, first DBR stack 51 is formed by alternately stacking an impurity-doped $Al_xGa_{1-x}As$ semiconductor compound and a GaAs compound. First DBR stack 51 partially transmits the light generated from active layer 53 with high reflectivity of about 99.6%.

Second DBR stack 55 as a semiconductor doped with a different impurity from that of first DBR stack 51 is formed by alternately stacking $Al_xGa_{1-x}As$ and GaAs compounds, which also has about 99.6% reflectivity, thereby partially transmitting light generated from active layer 53. Second electrode layer 57 has a cavity 58 via which the light passed through second DBR stack 55 is emitted. A positive voltage with respect to first electrode layer 43 is applied to second electrode layer 57 from an external power source via a connection terminal 61.

First electrode layer 43 provides a predetermined exposed surface 70 thereof, on which a connection terminal 63 for electrically connecting to external circuitry (e.g., a power source) is installed. In order to form exposed surface 70, optical source 50 stacked on photodetector 40 is selectively etched down through first DBR stack 51. As a result, exposed surface 70 is formed on first electrode layer 43, so that connection terminal 63 can be installed. Here, however, though it is virtually impossible to sharply etch optical source 50 to the boundary between first electrode layer 43 and first DBR stack 51, such imperfect etching does not affect electrical connection with an external power source. Upon being applied with electrical power, optical source 50 vertically emits light of a predetermined wavelength. Though light is also emitted laterally, this light is not used in the present invention.

Photodetector 40 receives light which is emitted from the bottom of optical source 50 and passed through first DBR stack 51, for monitoring optical source 50. Since the amount of light emitted from the upper surface is proportional to the amount of the downward-emitted light which is detected by photodetector 40, the amount of light emitted via cavity 58 can be estimated. Thus, a signal obtained from the detected light amount can be used to control the intensity of the applied current, thereby controlling the amount of light emitted via cavity 58.

As described above, the photodetector and the optical source are integrally stacked on a semiconductor substrate, so that the structure can be miniaturized and the amount of light to be output can be precisely controlled.

Figure 4A:
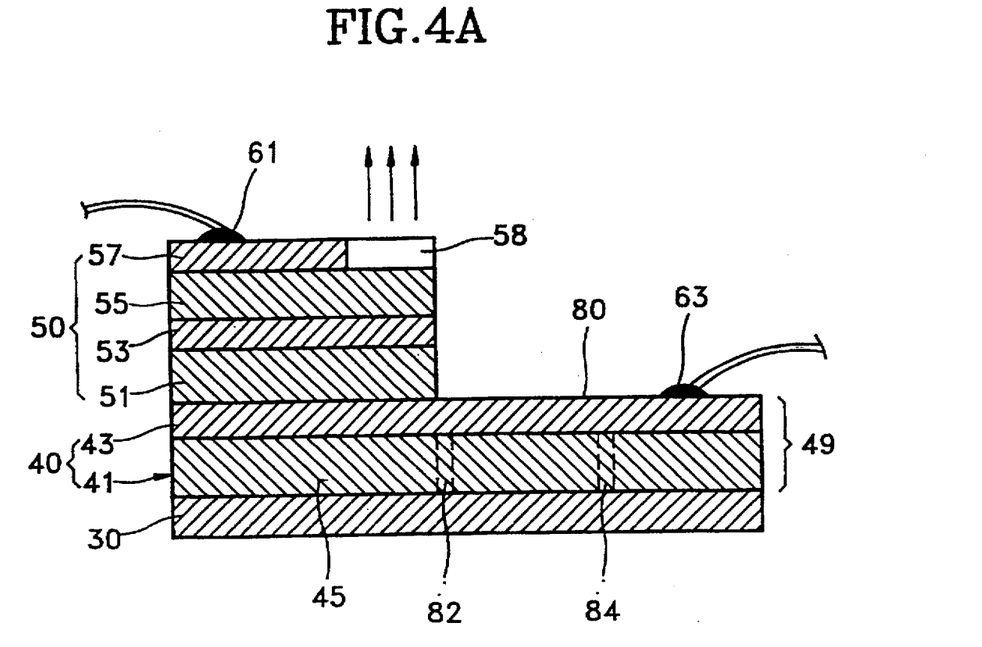
FIGS. 4A and 4B are a sectional view and a plan view of the second embodiment of a VCSEL device according to the present invention, respectively.
Figure 4B:
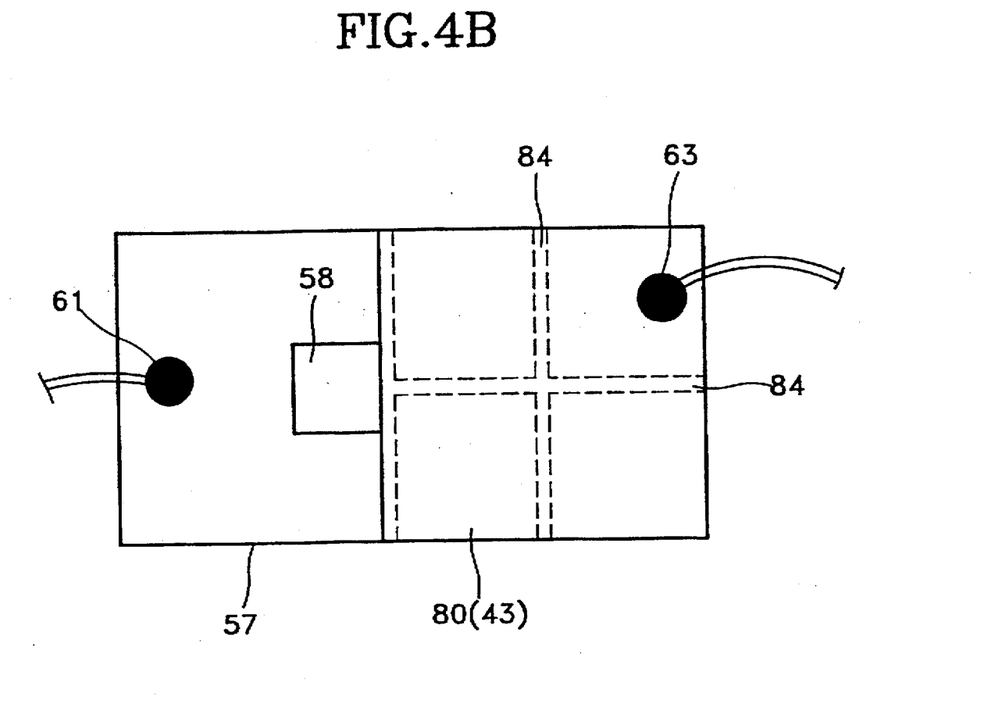

The second preferred embodiment of the VCSEL device according to the present invention, also comprising a photodetector 40 and an optical source 50 which are stacked on a semiconductor substrate 30, will be described with reference to FIGS. 4A and 4B. Here, semiconductor substrate 30, photodetector 40 and optical source 50 are made of the same materials and have the same layered structure as in the first preferred embodiment described with reference to FIGS. 3A and 3B.

In contrast to the first embodiment, however, the area of an exposed surface 80 of photodetector 40 is wider than a contact area contacting to optical source 50. As in the first embodiment, a connection terminal 63 for connection with the external power source is formed on exposed surface 80. Also, an optical system (not shown) for directing the light emitted via cavity 58 and reflected from a recording surface of a disk (not shown) to exposed surface 80 is constructed, and a main photodetector 49 for an error signal detection, which is a portion of photodetector 40, is located beneath exposed surface 80.

Main photodetector 49 is integrally formed with a monitoring photodetector 45 which is the other portion of photodetector 40 and located beneath optical source 50. That is, monitoring photodetector 45 and main photodetector 49 share first electrode layer 43 and buffer layer 41. Also, a blocking wall 82 for electrically blocking the interference of an electrical signal converted from the optical signal respectively received by photodetectors 45 and 49 is formed in buffer layer 41. The intrinsic buffer layer constituting monitoring photodetector 45 and the intrinsic buffer layer constituting main photodetector 49 are divided by blocking wall 82.

Blocking wall 82 is formed through an etching or ion implantation process after buffer layer 41 is grown on semiconductor substrate 30. Then, first electrode layer 43 and optical source 50 are formed on buffer layer 41 as described above.

Monitoring photodetector 45 detects the light emitted from the bottom surface of optical source 50. On the contrary, main photodetector 49 detects the light which is emitted from the upper surface of optical source 50 and then reflected from an optical disk (not shown). Also, main photodetector 49 is divided into at least two to detect error signals, that is, focus and tracking error signals, according to the difference in the amount of light received by each divided portion. A boundary portion 84 of each divided portion may be also formed by the etching or ion implantation process like blocking wall 82.

Thus, the VCSEL device according to the second embodiment can be formed with a compact structure by integrally forming optical source 50, monitoring photodetector 45, and main photodetector 49.

The third preferred embodiment of the VCSEL device according to the present invention will be described with reference to FIGS. 5A and 5B.

Figure 5A:
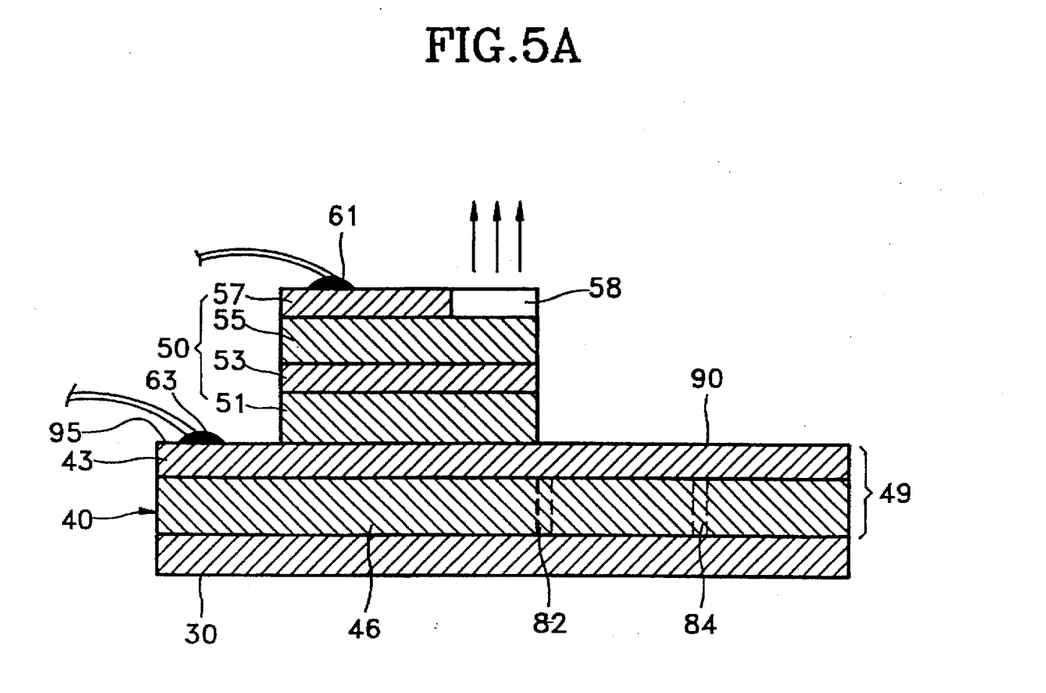
FIGS. 5A and 5B are a sectional view and a plan view of the third embodiment of a VCSEL device according to the present invention, respectively.
Figure 5B:
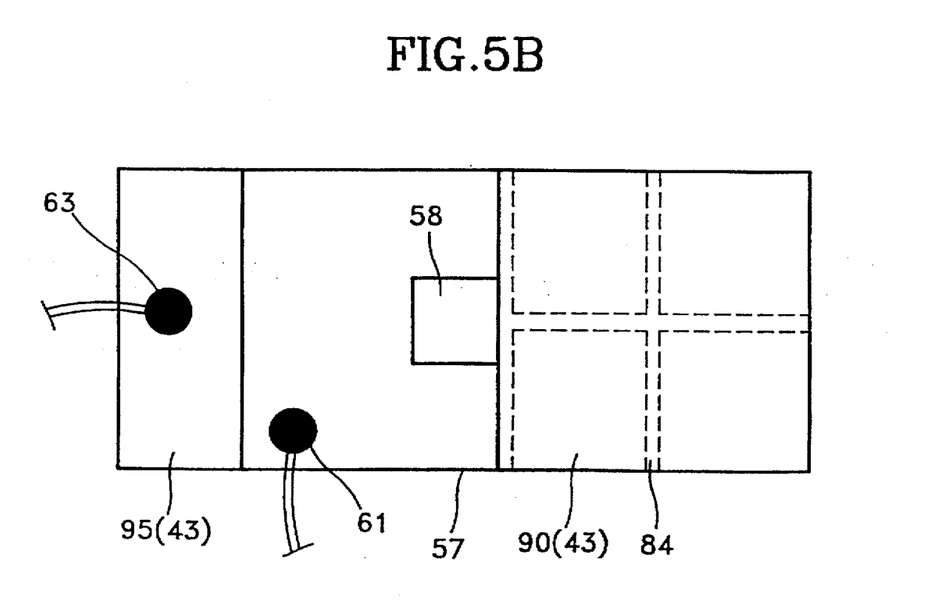

As shown in FIGS. 5A and 5B, the VCSEL is comprised of a semiconductor substrate 30, a photodetector 40 and an optical source 50, wherein photodetector 40 and optical source 50 are stacked on semiconductor substrate 30 in sequence.

Here, semiconductor substrate 30, photodetector 40 and optical source 50 are made of the same materials and have the same layered structure as in the first and second embodiments described above. Particularly, the structure of this embodiment is similar to that of the second embodiment.

Meanwhile, in contrast to the second embodiment, a second exposed surface 95 of a predetermined width is formed on a first electrode layer 43, opposite to a first exposed surface 90, in the same manner with first exposed surface 90. Also, a connection terminal 63 is installed on second exposed surface 95. In this preferred embodiment, the construction and operation of a monitoring photodetector 46, a main photodetector 49, blocking wall 82 and boundary portion 84 are the same as in the above second preferred embodiment.

As described above, by installing connection terminal 63 with a distance from first exposed surface 90 formed on main photodetector 49, the electrical influence of connection terminal 63 with respect to main photodetector 49 can be eliminated.

Figure 6A:
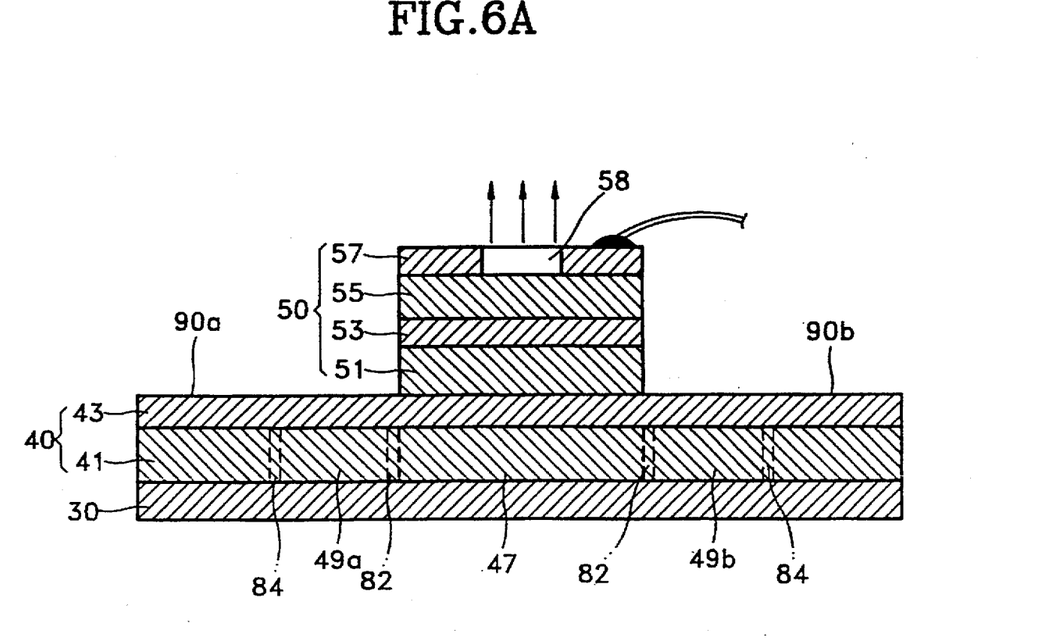
FIGS. 6A and 6B are a sectional view and a plan view of the fourth embodiment of a VCSEL device according to the present invention, respectively.

The fourth preferred embodiment of the VCSEL device according to the present invention will be described with reference to FIGS. 6A and 6B.

As in the first to third preferred embodiments, the VCSEL is comprised of a semiconductor substrate 30, a photodetector 40 and an optical source 50, wherein semiconductor substrate 30, photodetector 40 and optical source 50 are made of the same materials and have the same layered structure as in the above embodiments.

Here, photodetector 40 is divided into a monitoring photodetector 47 located beneath optical source 50, and main photodetectors 49a and 49b each located beneath first and second exposed surfaces 90a and 90b which are formed in the left and right sides and wider than a contact area between first electrode layer 43 and optical source 50.

First and second exposed surfaces 90a and 90b are formed by etching both sides of optical source 50 after stacking optical source 50 on photodetector 40.

The main photodetector is comprised of first and second main photodetectors 49a and 49b for detecting error signals from the light received via first and second exposed surfaces 90a and 90b. Here, the main photodetector may be above two as required.

Figure 6B:
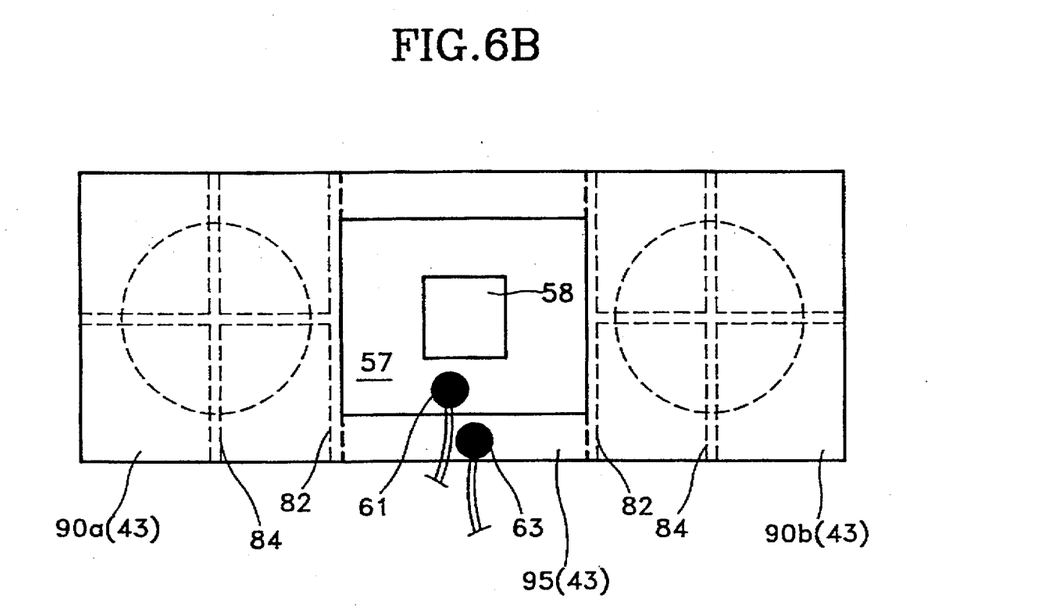

Also, in order to connect monitoring photodetector 47 beneath optical source 50 and first and second photodetectors 49a and 49b with the external power source, a third exposed surface 95 is formed at the front or back of the optical source, and a connection terminal 63 for connection with the external power source is formed on third exposed surface 95, as shown in FIG. 6B. Third exposed surface 95 may be formed by etching optical source 50 in a polygon, such as a rectangle, or a circular shape.

In this preferred embodiment, the construction and operation of the constituents which are not described are the same as those described in the first to third preferred embodiments.

The first preferred embodiment of an optical pickup apparatus adopting the VCSEL device according to the present invention will be described with reference to FIG. 7.

Figure 7:
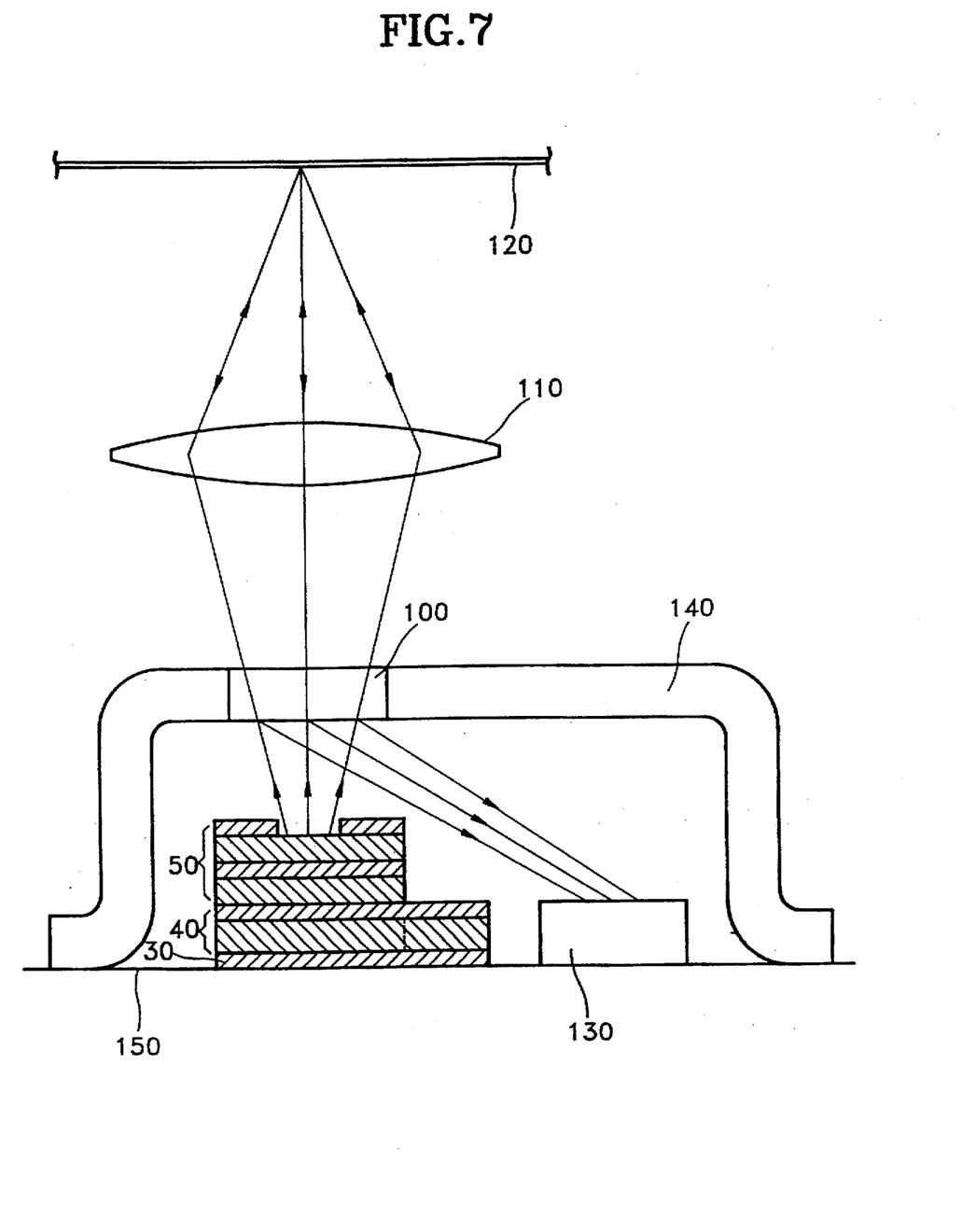
FIG. 7 is a sectional view showing an optical pickup apparatus adopting the VCSEL device according to the first embodiment of the present invention.

As shown in FIG. 7, the optical pickup for recording/reproducing information on an optical recording medium 120 is comprised of a diffracting means 100 located on a light path between optical source 50 and optical recording medium 120, an object lens 110, a main photodetector 130 for detecting error and information signals from the light reflected from optical recording medium 120, and a base 150.

Optical source 50 is the VCSEL integrated with monitoring photodetector 40 described with reference to FIGS. 3A and 3B.

It is preferable that diffracting means 100 as a hologram device with a pattern such that it transmits straight the light incident from the side of optical source 50 and adjusts light incident from the side of object lens 110 to be toward main photodetector 130.

Object lens 110 focuses light emitted from optical source 50 to form an optical spot on optical recording medium 120 and transmits light reflected from optical recording medium 120.

On base 150 on which optical source 50 is formed, main photodetector 130 for detecting light which is reflected from optical recording medium 120 and then diffracted by hologram device 100 is located. Main photodetector 130 is divided into at least two and detects focus and tracking error signals from the optical signal received by each divided portions. Also, main photodetector 130 may be plural as needed and the location thereof may be on somewhere of base 150, where main photodetector 130 can receive the light diffracted by hologram device 100.

Also, optical source 50 integrated with the monitoring photodetector and main photodetector 130 are enclosed by a housing 140 having a transmitting window which may be constructed of hologram device 100. Here, hologram device 100 may be installed on a separated place, wherein an optical system such as a grating (not shown) is further comprised between optical source 50 and optical recording medium 120.

The second preferred embodiment of the optical pickup apparatus adopting the VCSEL device according to the present invention will be described with reference to FIG. 8.

Figure 8:
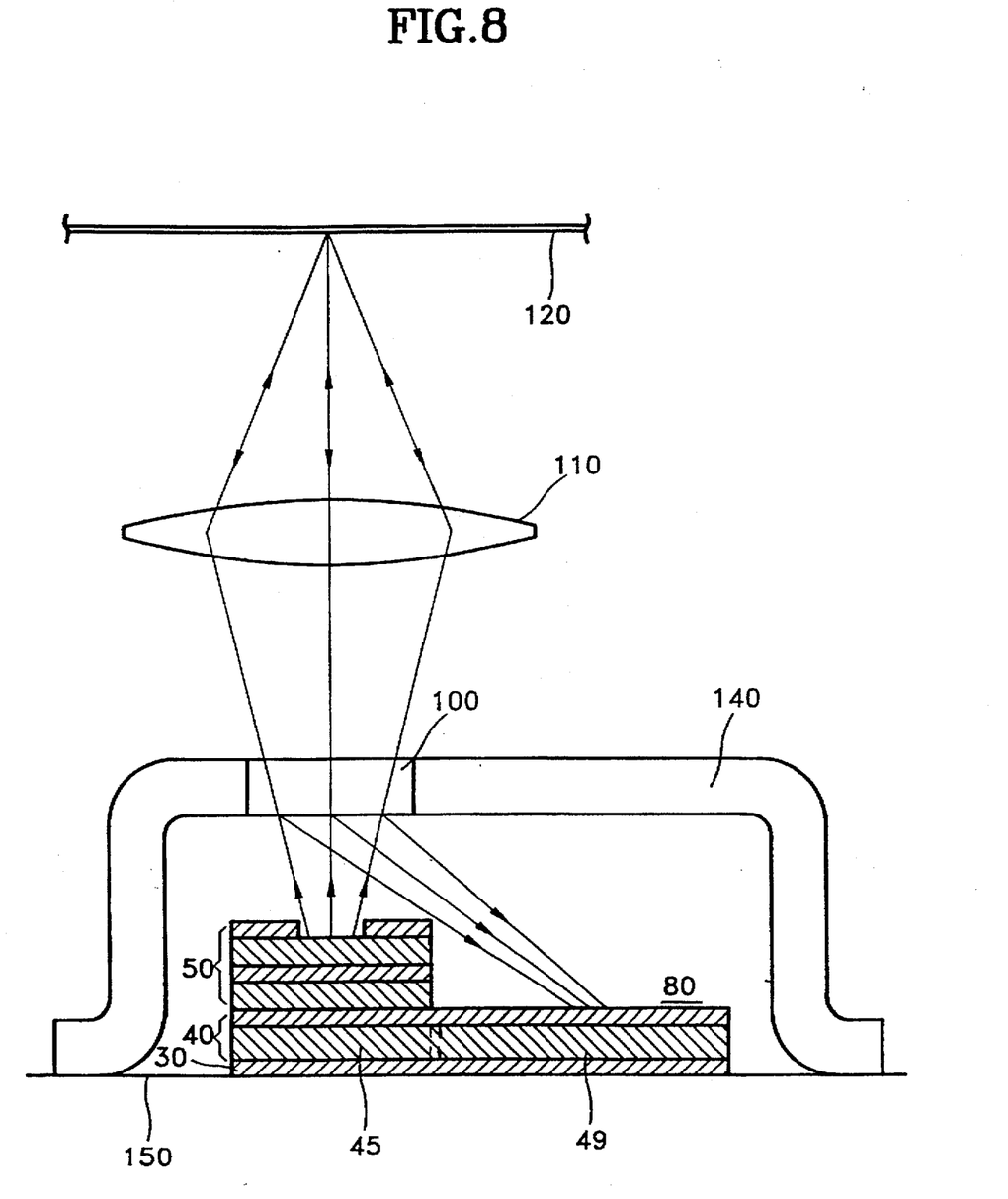
FIG. 8 is a sectional view showing an optical pickup apparatus adopting the VCSEL device according to the second embodiment of the present invention.

As shown in FIG. 8, the optical pickup apparatus is comprised of a VCSEL in which optical source 50 and photodetector are integrated, a diffracting means 100 placed on the light path between the VCSEL and optical recording medium 120, and an object lens 110.

Optical source 50 as the photodetector-integrated VCSEL is integrally formed with monitoring photodetector 45 and main photodetector 49, as described with reference to FIGS. 4A and 4B.

As in the first embodiment, optical pickup 50 integrated with monitoring photodetector 45 and main photodetector 49 is enclosed by housing 140 having a transmitting window, wherein it is preferable that the transmitting cavity is constructed as hologram device 100.

The construction and operation of the remaining constituents in this preferred embodiment are the same those as the first preferred embodiment. Thus, the description thereof will be omitted.

The third preferred embodiment of the optical pickup apparatus adopting the VCSEL device according to the present invention will be described with reference to FIG. 9.

Figure 9:
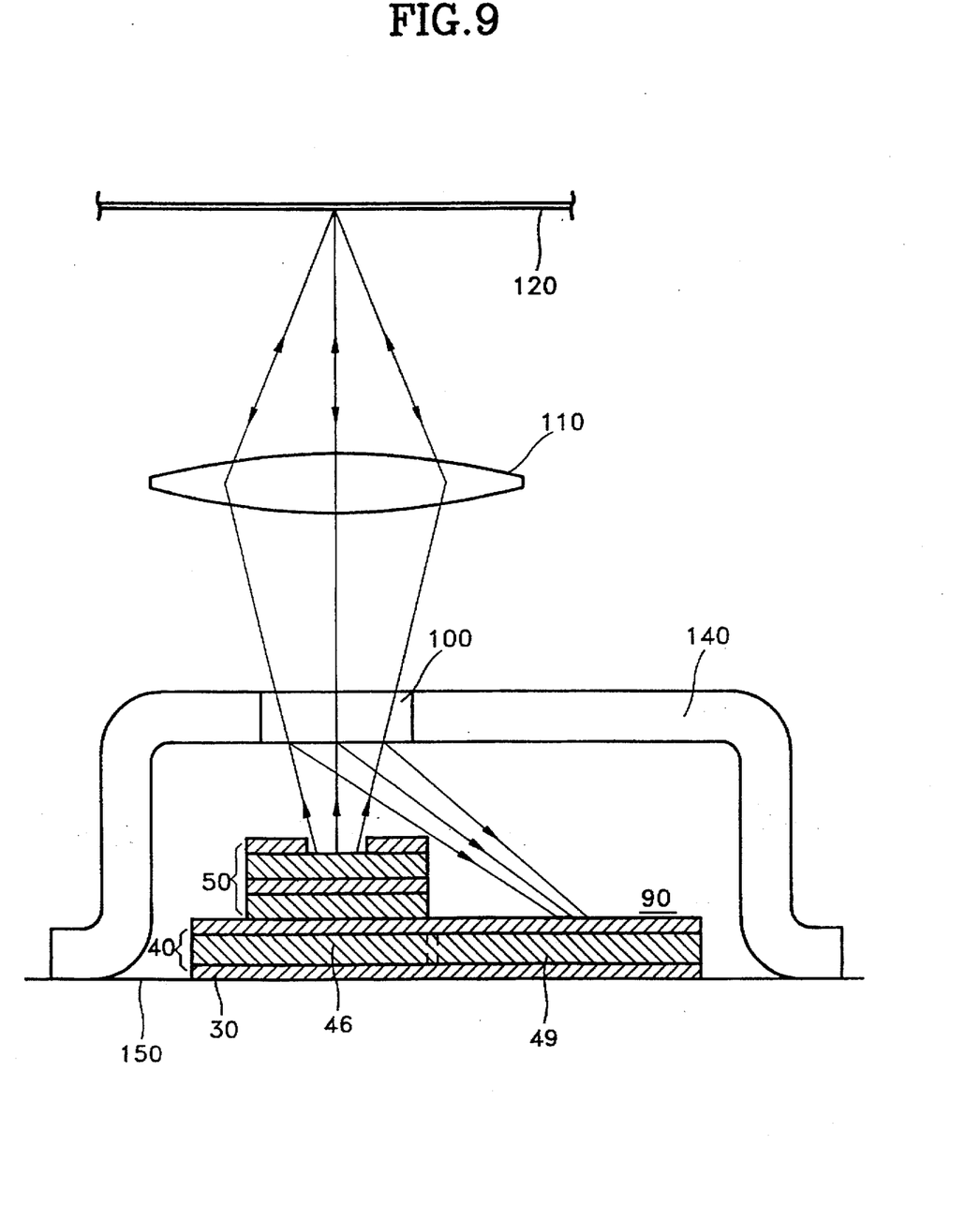
FIG. 9 is a sectional view showing an optical pickups. apparatus adopting the VCSEL device according to the third embodiment of the present invention.

As shown in FIG. 9, the optical pickup apparatus is comprised of a VCSEL in which optical source 50 and a photodetector are integrally formed, a diffracting means 100 located on the light path between the VCSEL and optical recording medium 120, and an object lens 110.

The construction of optical source 50 and the photodetector is the same as the VCSEL integrally formed with monitoring photodetector 46 and main photodetector 49, which is described above with reference to FIGS. 5A and 5B.

In this present invention, the remaining constituents are the same as the optical system described referring to FIGS. 7 and 8, so that the detailed description thereof will be omitted.

The fourth preferred embodiment of the optical pickup apparatus adopting the VCSEL device according to the present invention will be described with reference to FIG. 10.

Figure 10:
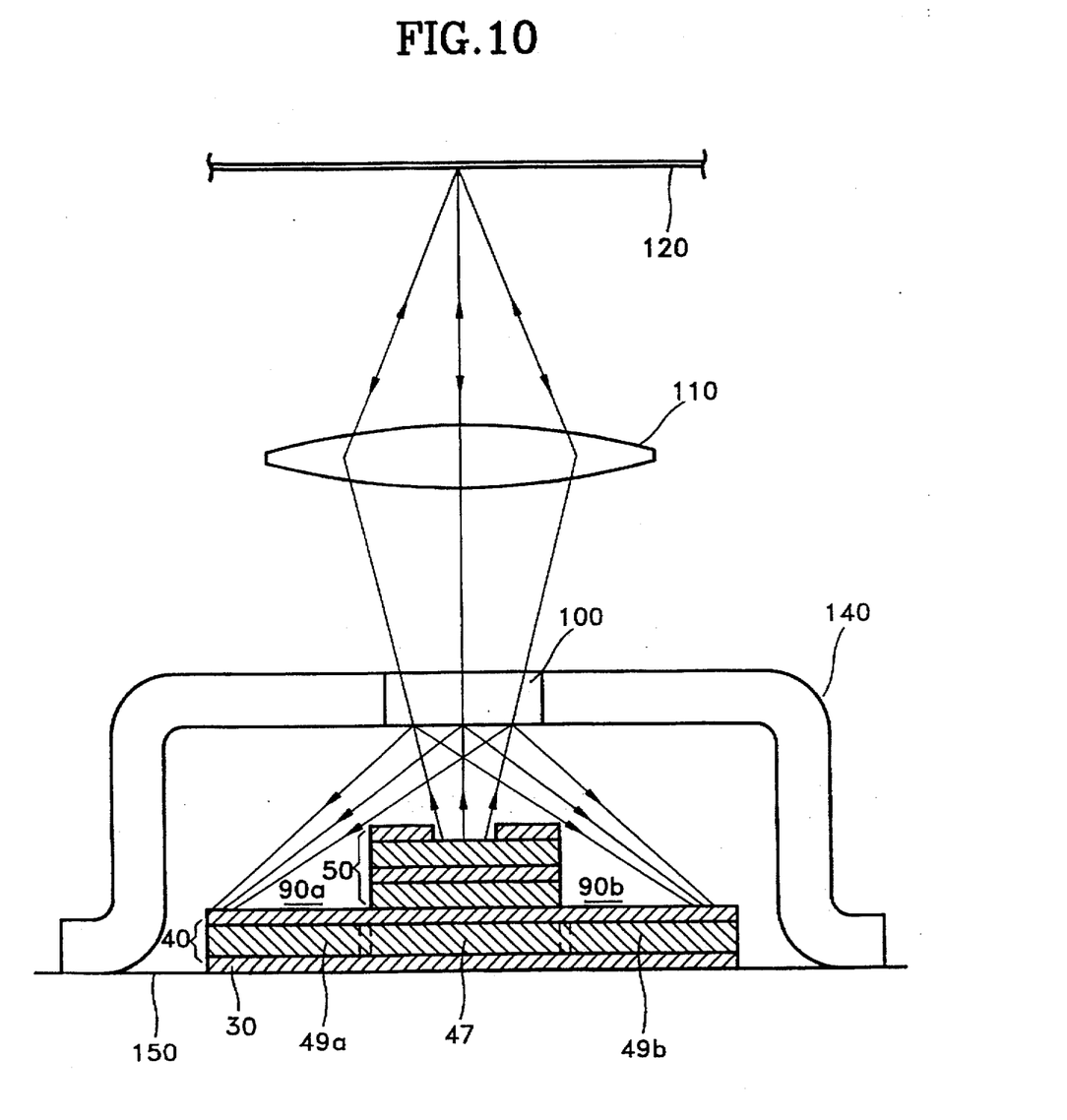
FIG. 10 is a sectional view showing an optical pickup apparatus adopting the VCSEL device according to the fourth embodiment of the present invention.

As shown in FIG. 10, the optical pickup apparatus is comprised of a VCSEL in which optical source 50 and a photodetector are integrally formed, a diffracting means 100 located on the light path between the VCSEL and optical recording medium 120, and an object lens 110.

The construction of optical source 50 and the photodetector is the same as the VCSEL integrally formed with monitoring photodetector 47 and main photodetectors 49a and 49b, which is described with reference to FIGS. 6A and 6B.

Preferably, diffracting means 100 is formed of a hologram device and has a divided pattern for adjusting light reflected by optical recording medium 120 to be toward main photodetectors 49a and 49b which are formed by being divided into at least two.

In this preferred embodiment, the remaining constituents are the same as the optical system described with reference to FIGS. 7 and 8, so that the detailed description thereof will be omitted.

Therefore, in the VCSEL device and optical pickup apparatus adopting the same according to the present invention, the amount of light emitted from the optical source is not decreased and can be effectively controlled, and a simplified structure can be enabled.

Although the present invention has been described with reference to preferred embodiments, those skilled in the art will recognize that changes may be made to the disclosed embodiments without departing from the scope or spirit of the invention.

What is claimed is:

1. A vertical cavity surface emitting laser (VCSEL) device comprising:

a semiconductor substrate;

a photodetector having an intrinsic buffer layer formed on said semiconductor substrate for receiving light incident thereto and a first electrode layer formed on said intrinsic buffer layer; and an optical source having a first distributed Bragg reflecting (DBR) stack formed on said first electrode layer for reflecting most of light incident thereto and transmitting the remainder thereof, an active layer formed on said first DBR stack for generating light, a second distributed Bragg reflecting (DBR) stack formed on said active layer for reflecting most of light incident thereto and transmitting the remainder thereof, and a second electrode layer formed on said second DBR stack formed with a cavity via which light transmitted through said second DBR stack is emitted, wherein said first electrode layer has an exposed surface on which said optical source is not formed, and a terminal for connecting said first electrode layer with an external power source is formed on said exposed surface, and wherein said exposed surface is formed on both sides of said optical source.

2. The VCSEL device as claimed in claim 1, wherein said photodetector detects light emitted downward from said optical source in order to control the amount of light emitted from the upper surface of said optical source.

3. The VCSEL device as claimed in claim 1, wherein said photodetector is comprised of a monitoring photodetector located beneath said optical source, for detecting downward-emitted light, and a main photodetector located beneath said first electrode layer, for detecting light emitted via said cavity.

4. The VCSEL device as claimed in claim 3, wherein said terminal is formed being separated from the exposed surface corresponding to said main photodetector.

5. A vertical cavity surface emitting laser (VCSEL) device comprising:

a semiconductor substrate;

a photodetector having an intrinsic buffer layer formed on said semiconductor substrate for receiving light incident thereto and a first electrode layer formed on said intrinsic buffer layer; and an optical source having a first distributed Bragg reflecting (DBR) stack formed on said first electrode layer for reflecting most of light incident thereto and transmitting the remainder thereof, an active layer formed on said first DBR stack for generating light, a second distributed Bragg reflecting (DBR) stack formed on said active layer for reflecting most of light incident thereto and transmitting the remainder thereof, and a second electrode layer formed on said second DBR stack formed with a cavity via which light transmitted through said second DBR stack is emitted, wherein said first electrode layer has an exposed surface on which said optical source is not formed, and a terminal for connecting said first electrode layer with an external power source is formed on said exposed surface, and wherein said exposed surface is formed around said optical source.

6. A vertical cavity surface emitting laser (VCSEL) device comprising:

a semiconductor substrate;

a photodetector having an intrinsic buffer layer formed on said semiconductor substrate for receiving light incident thereto and a first electrode layer formed on said intrinsic buffer layer; and an optical source having a first distributed Bragg reflecting (DBR) stack formed on said first electrode layer for reflecting most of light incident thereto and transmitting the remainder thereof, an active layer formed on said first DBR stack for generating light, a second distributed Bragg reflecting (DBR) stack formed on said active layer for reflecting most of light incident thereto and transmitting the remainder thereof, and a second electrode layer formed on said second DBR stack formed with a cavity via which light transmitted through said second DBR stack is emitted, wherein said first electrode layer has an exposed surface on which said optical source is not formed, and a terminal for connecting said first electrode layer with an external power source is formed on said exposed surface, and wherein said photodetector is comprised of a monitoring photodetector located beneath said optical source, for detecting downward-emitted light, and a main photodetector located beneath said exposed surface, for detecting light emitted via said cavity.

7. The VCSEL device as claimed in claim 6, wherein said terminal is formed being separated from the exposed surface corresponding to said main photodetector.

8. An optical pickup apparatus for use with an optical recording medium comprising:

a VCSEL device including a semiconductor substrate, a first photodetector having an intrinsic buffer layer and a first electrode layer which are stacked on said semiconductor substrate in sequence, and an optical source having a first DBR stack, an active layer, a second DBR stack and a second electrode layer formed with a cavity which are stacked on said first electrode layer in sequence, wherein said first electrode layer has an exposed surface on which said optical source is not formed, and a terminal for connecting said first electrode layer with an external power source is formed on said exposed surface;

an object lens placed between said optical source and the optical recording medium, for focusing light emitted from said optical source to form a spot on the optical recording medium;

light path changing means located between said object lens and said optical source, for changing the path of light incident from said object lens with respect to the path of light incident from said optical source; and a second photodetector for detecting light passed through said light path changing means;

wherein said exposed surface is formed on both sides of said optical source.

9. The optical pickup apparatus as claimed in claim 8, wherein said first photodetector detects light emitted downward from said optical source in order to control the amount of light emitted from the upper surface of said optical source, and said second photodetector is located beneath said exposed surface of said first electrode layer, adjacent to said first photodetector.

10. An optical pickup apparatus for use with an optical recording medium comprising:

a VCSEL device including a semiconductor substrate, a first photodetector having an intrinsic buffer layer and a first electrode layer which are stacked on said semiconductor substrate in sequence, and an optical source having a first DBR stack, an active layer, a second DBR stack and a second electrode layer formed with a cavity which are stacked on said first electrode layer in sequence, wherein said first electrode layer has an exposed surface on which said optical source is not formed, and a terminal for connecting said first electrode layer with an external power source is formed on said exposed surface;

an object lens placed between said optical source and the optical recording medium, for focusing light emitted from said optical source to form a spot on the optical recording medium;

light path changing means located between said object lens and said optical source, for changing the path of light incident from said object lens with respect to the path of light incident from said optical source; and a second photodetector for detecting light passed through said light path changing means;

wherein said exposed surface is formed around said optical source.

11. An optical pickup apparatus for use with an optical recording medium comprising:

a VCSEL device including a semiconductor substrate, a first photodetector having an intrinsic buffer layer and a first electrode layer which are stacked on said semiconductor substrate in sequence, and an optical source having a first DBR stack, an active layer, a second DBR stack and a second electrode layer formed with a cavity which are stacked on said first electrode layer in sequence, wherein said first electrode layer has an exposed surface on which said optical source is not formed, and a terminal for connecting said first electrode layer with an external power source is formed on said exposed surface;

an object lens placed between said optical source and the optical recording medium, for focusing light emitted from said optical source to form a spot on the optical recording medium;

light path changing means located between said object lens and said optical source, for changing the path of light incident from said object lens with respect to the path of light incident from said optical source; and a second photodetector for detecting light passed through said light path changing means;

wherein said first photodetector detects light emitted downward from said optical source in order to control the amount of light emitted from the upper surface of said optical source, and said second photodetector is located beneath said exposed surface of said first electrode layer, adjacent to said first photodetector.

12. The optical pickup apparatus as claimed in claim 11, wherein said optical source and said first and second photodetectors are enclosed by a housing having a transmitting window.

13. The optical pickup apparatus as claimed in claim 12, wherein the transmitting window of said housing is a hologram device.

14. The optical pickup apparatus as claimed in claim 12, wherein the transmitting window of said housing comprises said light path changing means.

15. A vertical cavity surface emitting laser (VCSEL) device comprising:

a semiconductor substrate;

a photodetector, formed on said semiconductor substrate, for receiving light incident thereto and including a first electrode layer; and an optical source, formed on said first electrode layer, for generating light, including a second electrode layer formed with a cavity via which the generated light is emitted;

wherein said first electrode layer has an exposed surface on which said optical source is not formed, and a terminal for connecting said first electrode layer with an external power source is formed on said exposed surface;

wherein said exposed surface is formed on one side of said optical source; and wherein said photodetector is comprised of a monitoring photodetector located beneath said optical source, for detecting downward-emitted light, and a main photodetector located beneath said exposed surface, for detecting light emitted via said cavity.

16. The VCSEL device as claimed in claim 15, wherein said terminal is formed being separated from the exposed surface corresponding to said main photodetector.

17. A vertical cavity surface emitting laser (VCSEL) device comprising:

a semiconductor substrate;

a photodetector, formed on said semiconductor substrate, for receiving light incident thereto and including a first electrode layer; and an optical source, formed on said first electrode layer, for generating light, including a second electrode layer formed with a cavity via which the generated light is emitted;

wherein said first electrode layer has an exposed surface on which said optical source is not formed, and a terminal for connecting said first electrode layer with an external power source is formed on said exposed surface; and wherein said exposed surface is formed on both sides of said optical source.

18. The VCSEL device as claimed in claim 17, wherein said photodetector is comprised of a monitoring photodetector located beneath said optical source, for detecting downward-emitted light, and a main photodetector located beneath said exposed surface, for detecting light emitted via said cavity.

19. The VCSEL device as claimed in claim 18, wherein said terminal is formed being separated from a portion of the exposed surface corresponding to said main photodetector.

20. The VCSEL device as claimed in claim 18, further comprising a blocking wall formed between said monitor photodetector and said main photodetector.

21. The VCSEL device as claimed in claim 17, wherein said photodetector detects light emitted downward from said optical source in order to control the amount of light emitted from the upper surface of said optical source.

22. A vertical cavity surface emitting laser (VCSEL) device comprising:

a semiconductor substrate;

a photodetector, formed on said semiconductor substrate, for receiving light incident thereto and including a first electrode layer; and an optical source, formed on said first electrode layer, for generating light, including a second electrode layer formed with a cavity via which the generated light is emitted;

wherein said first electrode layer has an exposed surface on which said optical source is not formed, and a terminal for connecting said first electrode layer with an external power source is formed on said exposed surface; and wherein said exposed surface is formed around said optical source.

23. The VCSEL device as claimed in claim 22, wherein said photodetector is comprised of a monitoring photodetector located beneath said optical source, for detecting downward-emitted light, and plural main photodetectors located beneath said exposed surface, for detecting light emitted via said cavity.

24. The VCSEL device as claimed in claim 23, wherein said terminal is formed being separated from a portion of the exposed surface corresponding to said main photodetector.

* * * * *